(12) United States Patent
Tagawa et al.

(10) Patent No.: US 6,876,524 B2
(45) Date of Patent: Apr. 5, 2005

(54) MAGNETORESISTIVE TRANSDUCER HAVING STRONGER LONGITUDINAL BIAS FIELD

(75) Inventors: Ikuya Tagawa, Kawasaki (JP); Kenichiro Yamada, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 18 days.

(21) Appl. No.: 09/808,253

(22) Filed: Mar. 14, 2001

(65) Prior Publication Data

US 2002/0071224 A1 Jun. 13, 2002

(30) Foreign Application Priority Data

Dec. 12, 2000 (JP) ........................................ 2000-377033

(51) Int. Cl.$^7$ ................................................ G11B 5/39
(52) U.S. Cl. ................. 360/324.12; 360/319; 360/322
(58) Field of Search ........................ 360/324.1, 324.12, 360/319, 322, 327.3–327.32, 327.1, 327.2, 327.33, 126, 327.23; 324/252, 207.21; 338/32 R, 32 H

(56) References Cited

U.S. PATENT DOCUMENTS

| | | | | | |
|---|---|---|---|---|---|
| 4,918,554 | A | * | 4/1990 | Bajorek et al. | 360/319 |
| 5,800,935 | A | * | 9/1998 | Ishi | 428/692 |
| 5,872,689 | A | * | 2/1999 | Gill | 360/327.31 |
| 6,094,328 | A | * | 7/2000 | Saito | 360/324.12 |
| 6,256,177 | B1 | * | 7/2001 | Urai et al. | 360/324.12 |
| 6,313,973 | B1 | * | 11/2001 | Fuke et al. | 360/324.1 |
| 6,333,842 | B1 | * | 12/2001 | Nobuyuki et al. | 360/324.2 |
| 6,341,052 | B2 | * | 1/2002 | Hayashi | 360/324.1 |
| 6,344,955 | B1 | * | 2/2002 | Sato et al. | 360/327.32 |
| 6,347,022 | B1 | * | 2/2002 | Saito | 360/126 |
| 6,369,993 | B1 | * | 4/2002 | Hayashi | 360/327.2 |
| 6,396,669 | B1 | * | 5/2002 | Gill | 360/319 |
| 6,434,814 | B1 | * | 8/2002 | Chang et al. | 29/603.14 |
| 6,447,935 | B1 | * | 9/2002 | Zhang et al. | 428/692 |
| 6,657,824 | B1 | * | 12/2003 | Onuma | 360/319 |

FOREIGN PATENT DOCUMENTS

| | | |
|---|---|---|
| JP | 4161874 | 6/1992 |
| JP | 9-007122 | 1/1997 |

* cited by examiner

*Primary Examiner*—Brian E. Miller
(74) *Attorney, Agent, or Firm*—Greer, Burns & Crain, Ltd.

(57) ABSTRACT

A magnetoresistive transducer includes a magnetoresistive (MR) film interposed between domain control layers along the surface of a lower non-magnetic gap layer. Lead layers are formed on the domain control layers. An upper non-magnetic gap layer and an upper shield layer are sequentially formed to extend over the MR film and the lead layers. The upper shield layer is opposed to the surfaces of the MR element and the lead layers at a flat boundary or interface. The residual magnetization is supposed to exist in the upper shield layer in the direction of the magnetization established in the domain control layers after the upper shield layer has been subjected to the applied magnetic field for the magnetization of the domain control layers. The residual magnetization can be kept continuous along the flat interface of the upper shield layer. Any magnetic poles are hardly generated along the interface of the upper shield layer. The longitudinal bias field can be prevented from receiving the interaction of the residual magnetization in the upper shield layer. Reduction in the longitudinal bias field can thus be suppressed.

11 Claims, 12 Drawing Sheets

MAGNETORESISTIVE TRANSDUCER HAVING STRONGER LONGITUDINAL BIAS FIELD

BACKGROUND OF THE INVENTION

1. Field of the Invention

The present invention relates to a magnetoresistive transducer in general employed in a magnetic recording medium drive or storage device such as a magnetic disk drive and a magnetic tape drive. In particular, the invention relates to a magnetoresistive transducer including a magnetoresistive film extending over the surface of a fundamental layer such as a non-magnetic layer spreading over a lower shield layer, and a pair of domain control layers extending over the surface of the fundamental layer so as to interpose the magnetoresistive film along the fundamental layer.

2. Description of the Prior Art

A well-known magnetoresistive transducer is sometimes designed to include a spin valve magnetoresistive (MR) film, for example. The spin valve MR film allows the magnetization to rotate in a constitutive free ferromagnetic layer in response to the reversal of the magnetic polarity applied from the outside, as conventionally known. A relative angle defined between the rotating magnetization of the free ferromagnetic layer and the pinned magnetization established in a pinned ferromagnetic layer determines the electric resistance of the overall spin valve MR film. The variation in the resistance in response to the rotation of the magnetization in the free ferromagnetic layer can be utilized to detect the magnetic polarity of the applied magnetic field, for example, the magnetic bit data recorded on a magnetic recording medium. In this case, the single magnetic domain should be established in the free ferromagnetic layer of the spin valve MR film. This single magnetic domain of the free ferromagnetic layer is expected to greatly contribute to reduction in the Barkhausen noise.

A pair of hard magnetic layers magnetized in a so-called longitudinal direction are in general employed to establish the single magnetic domain in the free ferromagnetic layer. The hard magnetic layers interposing the spin valve MR film are supposed to establish the longitudinal bias field acting through the spin valve MR film. The longitudinal bias field is thus expected to greatly contribute to establishment of the single domain in the free ferromagnetic layer. However, the Barkhausen noise in fact cannot sufficiently be reduced in the magnetoresistive transducer irrespective of employment of the domain control hard magnetic layers.

SUMMARY OF THE INVENTION

It is accordingly an object of the present invention to provide a magnetoresistive transducer capable of reliably reducing the Barkhausen noise.

The inventors have examined the property of the existing magnetoresistive transducers in detail. The examination of the inventors has revealed that the magnetic poles are inevitably generated on an upper shield layer opposed to a magnetoresistive film in the existing magnetoresistive transducers. The residual magnetization established in the upper shield layer during the magnetizing process for establishing domain control hard magnetic layers is supposed to generate the magnetic poles. It has been confirmed that the magnetic poles generate a magnetic field reducing the longitudinal bias field established between the domain control hard magnetic layers.

According to a first aspect of the present invention, there is provided a magnetoresistive transducer comprising: a magnetoresistive film extending over the surface of a fundamental layer; a pair of domain control layers extending over the surface of the fundamental layer so as to interpose the magnetoresistive film along the fundamental layer; and an upper shield layer opposed to the magnetoresistive film at a first interface extending over a datum plane, said upper shield layer opposed to the domain control layers at a second interface extending over the datum plane.

In general, when the domain control layers are magnetized, the upper shield layer is simultaneously subjected to an applied magnetic field for the magnetization of the domain control layers. The upper shield layer made from a soft magnetic material is supposed to exhibit a residual magnetization in the direction of the magnetization established in the domain control layers after subjected to the applied magnetic field for the magnetization of the domain control layers. If the residual magnetization is forced to terminate at any end surface of the upper shield layer, magnetic poles or charges are established at the end surface, namely, the end of the magnetization, as well known.

Since the first and second interfaces of the upper shield layer are set to extend along the flat single datum plane in the aforementioned magnetoresistive transducer, the residual magnetization can be kept continuous to the utmost, and is hardly terminated on the lower surface of the upper shield layer at a region opposed to the magnetoresistive film. Any magnetic poles are hardly generated along the lower surface of the upper shield layer. The longitudinal bias field can be prevented from receiving the interaction of the residual magnetization in the upper shield layer. Reduction in the longitudinal bias field can thus be suppressed. In particular, if the first and second interfaces are made continuous without any gap or interval over the datum plane, generation of the magnetic poles can completely be avoided on the lower surface of the upper shield layer. The fundamental layer may in general be a lower non-magnetic gap layer spreading over the surface of a lower shield layer.

However, a groove may be formed on the upper shield layer so as to isolate the first and second interfaces from each other in the aforementioned magnetoresistive transducer. Even if the residual magnetization discontinues at the grooves, for example, the north and south poles are inevitably generated in pairs in the individual groove. The north and south poles in the individual groove are allowed to interact with each other, so that the north and south poles at the tip ends of the domain control layers cannot be influenced by the north and south poles in the grooves, respectively. Still, the longitudinal bias field can be avoided from reduction.

The magnetoresistive transducer preferably includes a lead layer made of an Au thin film interposed between the domain control layer and the upper shield layer. Employment of a material having a higher electric conductivity, such as Au, is expected to contribute to establishment of a thinner lead layer. The overall thickness of the stacked combination of the lead layer and the domain control layer may thus be set approximately equal to the thickness of the magnetoresistive film. The second interface opposed to the lead layer stacked on the domain control layer can be set to reliably extend over the datum plane including the first interface opposed to the magnetoresistive film.

The magnetoresistive transducer may further comprise an upper non-magnetic gap layer interposed between the magnetoresistive film and the upper shield layer. In this case, the upper shield layer is allowed to contact the upper non-magnetic gap layer at the first interface. In addition, the upper non-magnetic gap layer may extend over the lead layer. In this case, the upper shield layer is allowed to contact the upper non-magnetic gap layer at the second interface.

According to a second aspect of the present invention, there is provided a magnetoresistive transducer comprising: a magnetoresistive film extending over the surface of a fundamental layer; a pair of domain control layers extending over the surface of the fundamental layer so as to interpose the magnetoresistive film along the fundamental layer; an upper shield layer opposed to the fundamental layer at a lower interface so as to hold at least the magnetoresistive film against the fundamental layer; and a raised portion formed on the upper shield layer so as to swell from the lower interface toward the fundamental layer, wherein the product between the height of the raised portion and the magnetization intensity of the upper shield layer is set smaller than the product between the thickness and the magnetization intensity of the domain control layer.

The product between the height of the raised portion and the magnetization intensity of the upper shield layer corresponds to the intensity of the magnetic pole established in the upper shield layer. On the other hand, the product between the thickness and the magnetization intensity of the domain control layer likewise corresponds to the intensity of the magnetic pole established in the domain control layer for inducing the longitudinal bias field. When the product between the height of the raised portion and the magnetization intensity of the upper shield layer is set smaller than the product between the thickness and the magnetization intensity of the domain control layer, the magnetic poles generated on the domain control layer are hardly allowed to receive the influence of the magnetic poles generated on the upper shield layer, namely, the raised portion. Reduction in the longitudinal bias field can thus sufficiently be avoided. Here, the magnetization intensity can be represented by the intensity of the residual magnetization, the saturation magnetization, or the like.

In this case, the magnetoresistive transducer preferably includes a lead layer made of an Au thin film interposed between the domain control layer and the upper shield layer. Employment of a material having a higher electric conductivity, such as Au, is expected to contribute to establishment of a thinner lead layer. The overall thickness of the stacked combination of the lead layer and the domain control layer can be reduced to the utmost. When the upper shield layer is formed to extend over the lead layer of this type and the magnetoresistive film, it is possible to reliably reduce the height of the raised portion on the upper shield layer. An upper non-magnetic gap layer of a uniform thickness may be interposed between the lead layer and the upper shield layer as well as between the magnetoresistive film and the upper shield layer. In general, the fundamental layer may be a lower non-magnetic gap layer spreading over the surface of a lower shield layer.

According to a third aspect of the present invention, there is provided a magnetoresistive transducer comprising: a magnetoresistive film; a pair of domain control layers interposing the magnetoresistive film, said domain control layers magnetized in a normal longitudinal direction across the magnetoresistive film; and an upper shield layer covering over at least the magnetoresistive film, said upper shield layer magnetized in the reverse longitudinal direction opposite to the normal longitudinal direction.

In general, it is impossible to avoid generation of a raised portion swelling from the lower surface of the upper shield layer toward the magnetoresistive film unless the thickness of the domain control layer or a lead layer, stacked on the domain control layer, can significantly be reduced. The magnetization of the upper shield layer tends to terminate at any side end surface of the raised portion. This means that the magnetic poles tend to appear at the end surface of the raised portion. When the magnetization can be established in the reverse direction in the upper shield layer in the aforementioned manner, the magnetic poles generated at the end surface of the raised portion is easily allowed to have a polarity identical to the magnetic pole generated at the tip end of the nearest domain control layer. Diffusion of the magnetic flux from the domain control layer into the raised portion can thus be suppressed. The magnetic flux may rather be introduced from the raised portion into the domain control layer. The intensity of the magnetic pole generated at the tip end of the domain control layer can still be enhanced. The longitudinal bias field can be enhanced, too.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
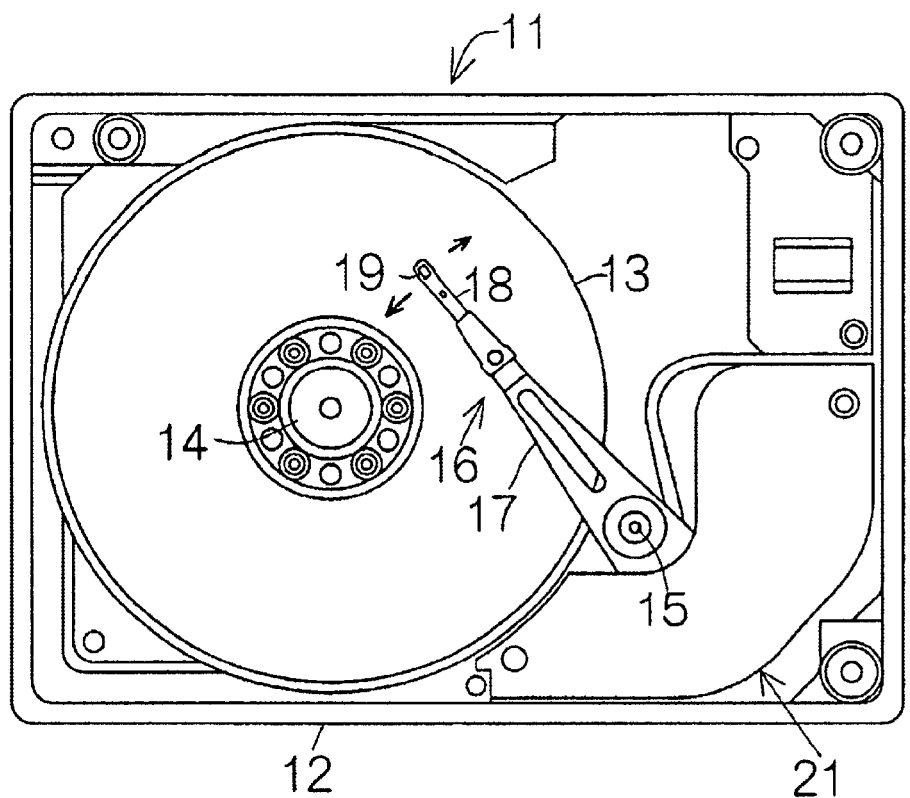
FIG. 1 is a plan view schematically illustrating the structure of a hard disk drive (HDD)

FIG. 1 schematically illustrates the interior structure of a hard disk drive (HDD) 11 as an example of a magnetic recording medium drive or storage device. The HDD 11 includes a box-shaped primary enclosure 12 defining an inner space of a flat parallelepiped, for example. At least one magnetic recording disk 13 is accommodated in the inner space within the primary enclosure 12. The magnetic recording disk 13 is mounted on a driving shaft of a spindle motor 14. The spindle motor 14 is allowed to drive the magnetic recording disk 13 for rotation at a higher revolution rate such as 7,200 rpm or 10,000 rpm, for example. A cover, not shown, is coupled to the primary enclosure 12 so as to define the closed inner space between the primary enclosure 12 and itself.

A carriage 16 is also accommodated in the inner space of the primary enclosure 12 for swinging movement about a vertical support shaft 15. The carriage 16 includes a rigid swinging arm 17 extending in the horizontal direction from the vertical support shaft 15, and an elastic head suspension 18 fixed to the tip end of the swinging arm 17 so as to extend forward from the swinging arm 17. As conventionally known, a flying head slider 19 is cantilevered at the head suspension 18 through a gimbal spring, not shown. The head suspension 18 serves to urge the flying head slider 19 toward the surface of the magnetic recording disk 13. When the magnetic recording disk 13 rotates, the flying head slider 19 is allowed to receive airflow generated along the rotating magnetic recording disk 13. The airflow serves to generate a lift on the flying head slider 19. The flying head slider 19 is thus allowed to keep flying above the surface of the magnetic recording disk 13 during rotation of the magnetic recording disk 13 at a higher stability established by the balance between the lift and the urging force of the head suspension 18.

When the carriage 16 is driven to swing about the support shaft 15 during flight of the flying head slider 19, the flying head slider 19 is allowed to cross the recording tracks defined on the magnetic recording disk 13 in the radial direction of the magnetic recording disk 13. This radial movement serves to position the flying head slider 19 right above a target recording track on the magnetic recording disk 13. In this case, an electromagnetic actuator 21 such as a voice coil motor (VCM) can be employed to realize the swinging movement of the carriage 16, for example. As conventionally known, in the case where two or more magnetic recording disks 13 are incorporated within the inner space of the primary enclosure 12, a pair of the elastic head suspensions 18 are mounted on a single common swinging arm 17 between the adjacent magnetic recording disks 13.

Figure 2:
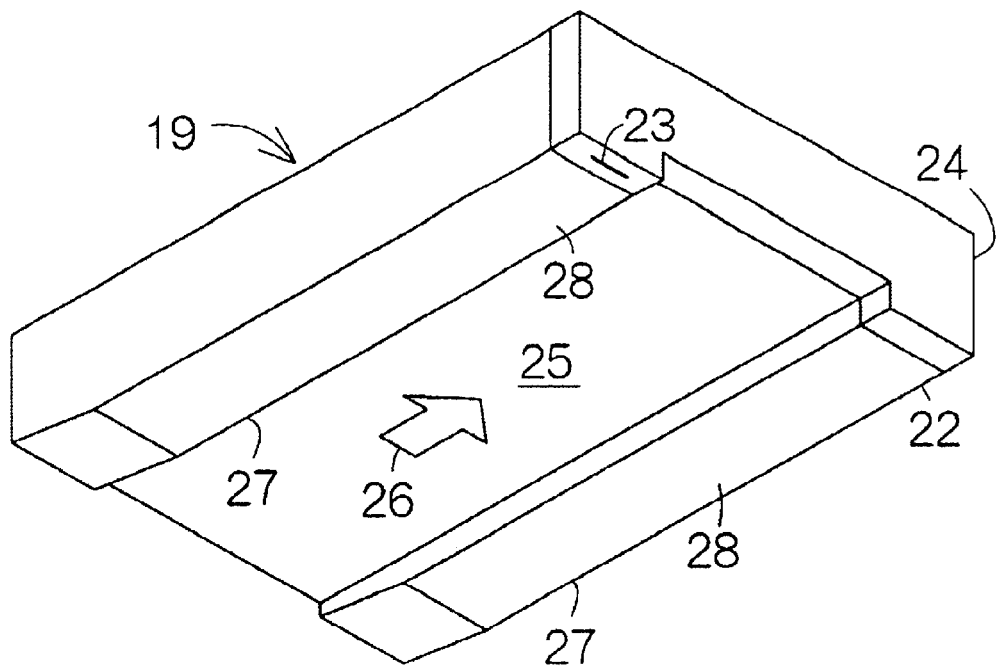
FIG. 2 is an enlarged perspective view schematically illustrating the structure of a flying head slider according to a specific example.

FIG. 2 illustrates a specific example of the flying head slider 19. The flying head slider 19 of this type includes a slider body 22 made from $Al_2O_3$—TiC in the form of a flat parallelepiped, and a head protection layer 24 formed to spread over the trailing or downstream end of the slider body 22. The head protection layer 24 may be made of $Al_2O_3$. A read/write electromagnetic transducer 23 is embedded in the head protection layer 24. A medium-opposed surface or bottom surface 25 is defined continuously over the slider body 22 and the head protection layer 24 so as to face the surface of the magnetic recording disk 13 at a distance. The bottom surface 25 is designed to receive airflow 26 generated along the surface of the rotating magnetic recording disk 13.

A pair of rails 27 are formed to extend over the bottom surface 25 from the leading or upstream end toward the trailing or downstream end. The individual rail 27 is designed to define an air bearing surface (ABS) 28 at its top surface. In particular, the airflow 26 generates the aforementioned lift at the respective air bearing surfaces 28. The read/write electromagnetic transducer 23 embedded in the head protection layer 24 is exposed at the air bearing surface 28 as described later in detail. The flying head slider 19 may take any shape or form other than the above-described one.

Figure 3:
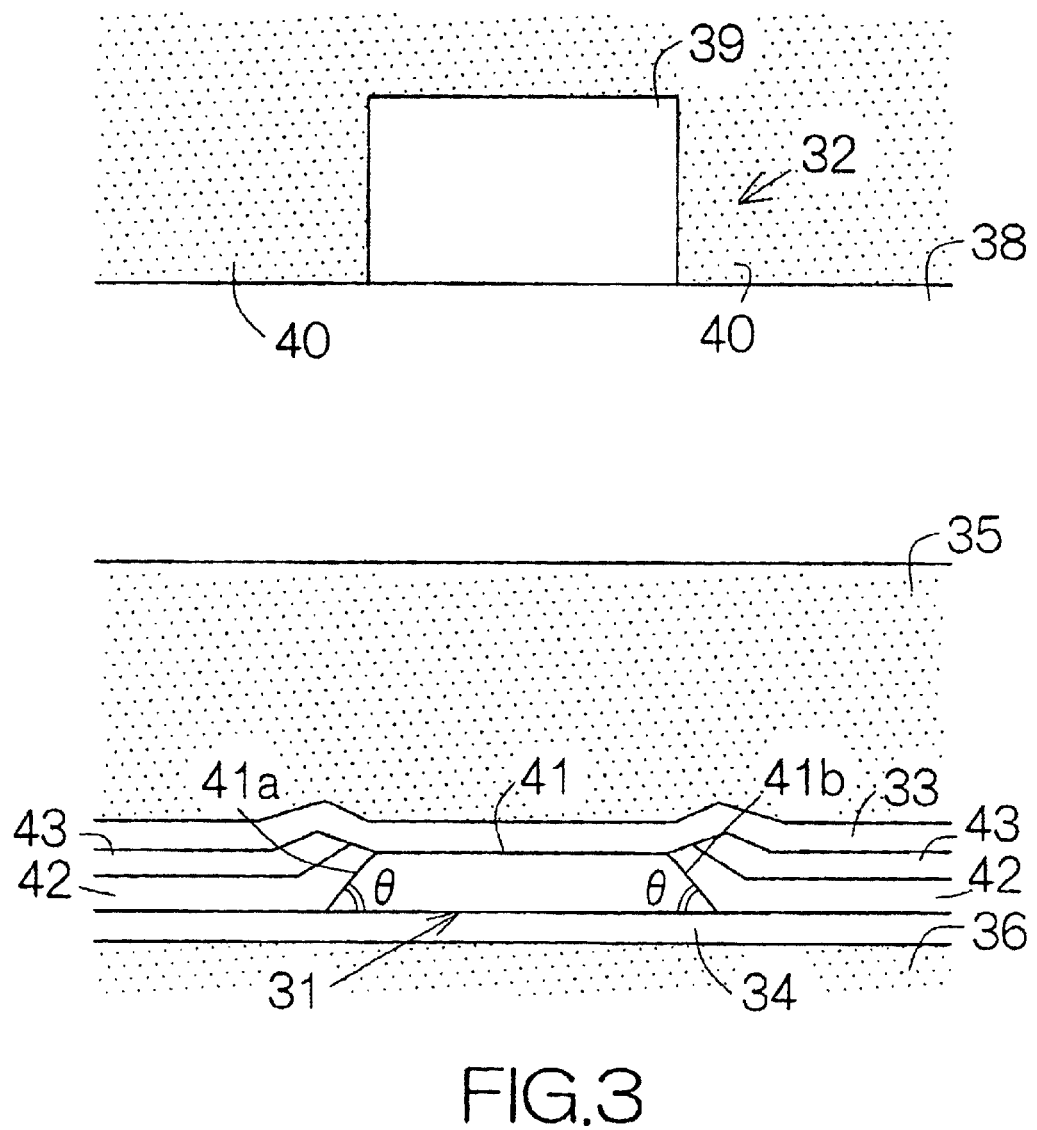
FIG. 3 is an enlarged front view of the flying head slider for illustrating a read/write electromagnetic transducer observed at the bottom surface.

FIG. 3 illustrates an enlarged detailed view of the read/write electromagnetic transducer 23 exposed at the bottom surface 25. The read/write electromagnetic transducer 23 includes a combination of a magnetoresistive (MR) element 31 according to a first embodiment of the present invention and an inductive write element or a thin film magnetic head 32. The MR element 31 is designed to read a magnetic bit data by utilizing variation in the electric resistance in response to a reversal of the magnetic polarity in a magnetic field acting from the magnetic recording disk 13. The thin film magnetic head 32 is designed to write a magnetic bit data by utilizing a magnetic field induced in a conductive swirly coil pattern, not shown, for example.

The MR element 31 is interposed between upper and lower non-magnetic gap layers 33, 34. The non-magnetic gap layers 33, 34 may be made from $Al_2O_3$, for example. The upper and lower non-magnetic gap layers 33, 34 thus interposing the MR element 31 is in turn interposed between upper and lower shield layers 35, 36. The upper and lower shield layers 35, 36 may be made from FeN, NiFe, or the like. The lower shield layer 36 is allowed to spread over the surface of an $Al_2O_3$ (alumina) layer, not shown, for providing an undercoat or a lower half of the aforementioned head protection layer 24.

The thin film magnetic head 32 includes a non-magnetic gap layer 38 extending on the surface of the upper shield layer 35. The non-magnetic gap layer 38 may be made from $Al_2O_3$, for example. An upper magnetic pole layer 39 is opposed to the upper shield layer 35. The non-magnetic gap layer 38 is thus interposed between the upper magnetic pole layer 39 and the upper shield layer 35. The upper magnetic pole layer 39 may be made from NiFe, for example. The upper magnetic pole layer 39 is covered with an $Al_2O_3$ (alumina) layer 40 spreading over the surface of the non-magnetic gap layer 38. The alumina layer 40 is designed to hold the MR element 31 and the thin film magnetic head 32 against the aforementioned alumina layer. Specifically, the alumina layer 40 functions as an overcoat or an upper half of the aforementioned head protection layer 24.

A combination of the upper magnetic pole layer 39 and the upper shield layer 35 establishes a magnetic core of the thin film magnetic head 32. Namely, the upper shield layer 35 of the MR element 31 functions as a lower magnetic pole layer of the thin film magnetic head 32. When a magnetic field is induced at the conductive swirly coil pattern, a magnetic flux is exchanged between the upper magnetic pole layer 39 and the upper shield layer 35. The non-magnetic gap layer 38 allows the exchanged magnetic flux to leak out of the bottom surface 25. The thus leaked magnetic flux forms a magnetic field for recordation, namely, a write gap magnetic field.

The MR element 31 includes a magnetoresistive (MR) film or a spin valve film 41 extending over the lower non-magnetic gap layer 34 serving as a fundamental layer. A pair of end surfaces 41a, 41b are defined on the spin valve film 41 along planes intersecting the planar surface of the lower non-magnetic gap layer 34. The end surfaces 41a, 41b or planes are designed to intersect the surface of the lower non-magnetic gap layer 34 by an inclined angle θ, respectively.

Likewise, a pair of hard magnetic stripe layers, namely, domain control stripe layers 42, are formed on the surface of the lower non-magnetic gap or fundamental layer 34 so as to interpose the spin valve film 41 along the lower non-magnetic gap layer 34. The domain control stripe layers 42 are designed to extend on the surface of the lower non-magnetic gap layer 34 along the bottom surface 25. The tip ends of the respective domain control stripe layers 42 are connected to the end surfaces 41a, 41b of the spin valve film 41. The domain control stripe layers 42 may be made from a metallic material such as CoPt, CoCrPt, or the like.

A pair of conductive terminal or lead layers 43 are formed to spread over the surfaces of the domain control stripe layers 42, respectively. The lead layers 43 are interposed between the domain control stripe layers 42 and the upper shield layer 35. A sensing current can be supplied to the spin valve film 41 through the lead layers 43. In this case, it is preferable to form the lead layers 43 with a material having a higher electric conductivity, such as Au or the like.

Figure 4:
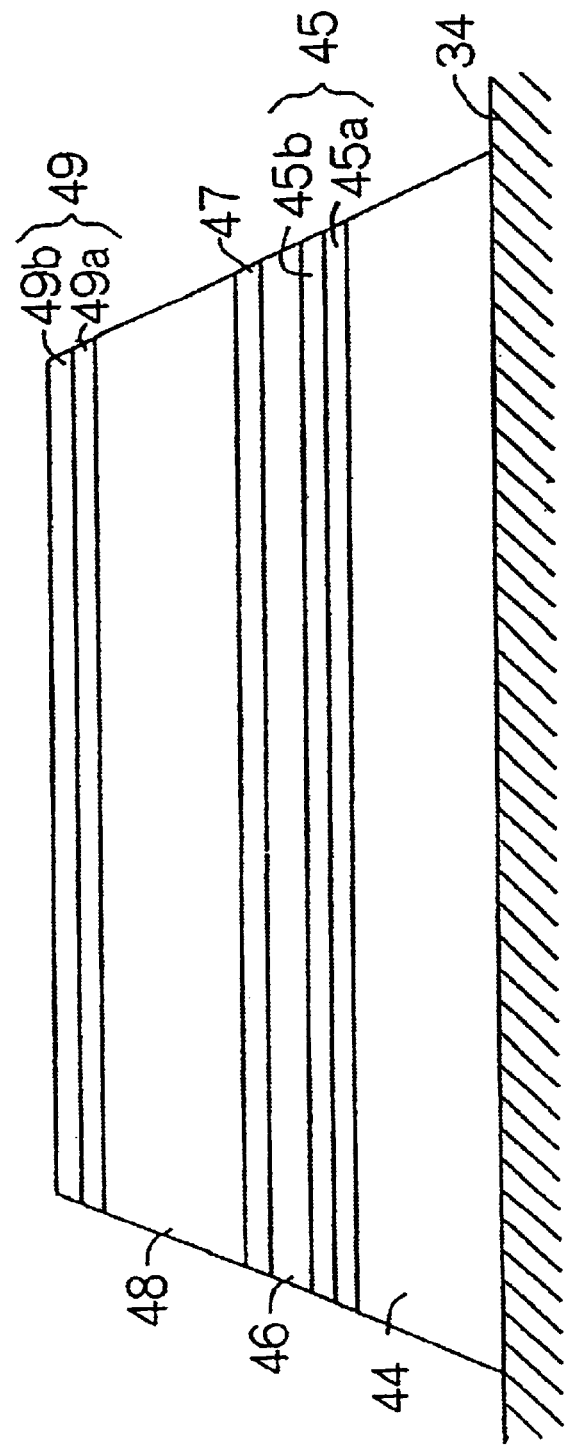
FIG. 4 is an enlarged partial sectional view of the flying head slider for schematically illustrating the structure of a spin valve film according to a specific example.

As shown in FIG. 4, the spin valve film 41 includes a basement layer 44 extending over the surface of the lower non-magnetic gap layer 34. The basement layer 44 may be made of Ta free ferromagnetic layer 45 is formed to extend on the surface of the basement layer 44. The free ferromagnetic layer 45 may be made of a layered ferromagnetic material including a NiFe layer 45a and a $Co_{90}Fe_{10}$ layer 45b formed to extend over the surface of the NiFe layer 45a. A non-magnetic spacer layer 46 is formed to extend over the surface of the free ferromagnetic layer 45. The non-magnetic spacer layer 46 may be made from an electrically conductive material such as Cu or the like, for example.

A pinned ferromagnetic layer 47 is formed to extend over the surface of the non-magnetic spacer layer 46. The pinned ferromagnetic layer 47 may be made from a ferromagnetic material such as $Co_{90}Fe_{10}$ or the like. An antiferromagnetic layer 48 as a pinning layer is superposed on the surface of the pinned ferromagnetic layer 47. The antiferromagnetic layer 48 may be made from an antiferromagnetic material such as FeMn, PdPtMn, or the like, for example. A strong exchange coupling can thus be established between the antiferromagnetic layer 48 and the pinned ferromagnetic layer 47. Specifically, the antiferromagnetic layer 48 serves to pin or fix the magnetization of the pinned ferromagnetic layer 47 in a specific direction. The surface of the antiferromagnetic layer 48 may be covered with a protection layer 49. The protection layer 49 may comprise a Cu layer 49a and a cap Ta layer 49b formed to extend over the surface of the Cu layer 49a.

When the MR element 31 is opposed to the surface of the magnetic recording disk 13 for reading a magnetic information data, the magnetization of the free ferromagnetic layer 45 is allowed to rotate in the spin valve film 41 in response to the reversal of the magnetic polarity applied from the magnetic recording disk 13, as conventionally known. The rotation of the magnetization in the free ferromagnetic layer 45 induces variation in the electric resistance of the spin valve film 41. When a sensing current is supplied to the spin valve film 41 through the lead layers 43, a variation in voltage appears in the sensing current, for example. The variation in voltage can be utilized to detect a magnetic bit data recorded on the magnetic recording disk 13.

Figure 5:
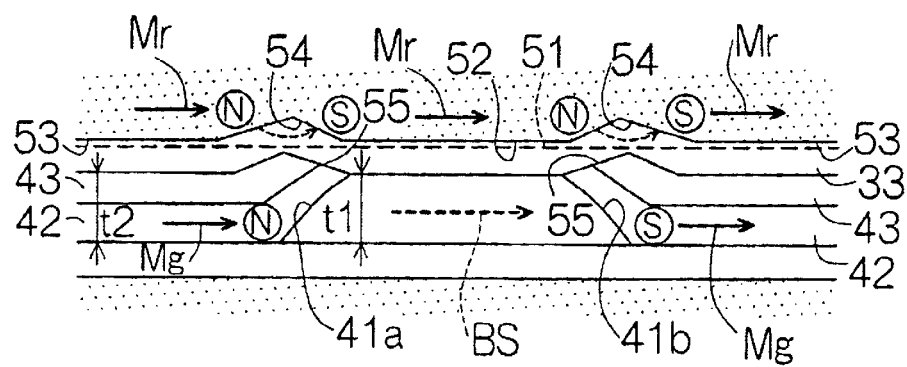
FIG. 5 is an enlarged partial front view of the read/write electromagnetic transducer for illustrating the structure of a magnetoresistive (MR) element according to a first embodiment of the present invention.

As is apparent from FIG. 5, the thickness t1 of the spin valve film 41 is set equal to the overall thickness t2 of the domain control stripe layer 42 and the lead layer 43. Accordingly, the upper shield layer 35 is allowed to define a first planar boundary or interface 52 opposed to the upper surface of the spin valve film 41 and second planar boundaries or interfaces 53 opposed to the surfaces of the domain control stripe layers 42, respectively. The first and second interfaces 52, 53 are designed to extend within a common single datum plane 51 vertical to the bottom surface 25. In this case, grooves 54 may be formed on the upper shield layer 35 between the first and second interfaces 52, 53, respectively, so as to extend in a direction perpendicular to the bottom surface 25. The grooves 54 are designed to isolate or space the first and second interfaces 52, 53 from each other. As generally known, the domain control stripe layers 42 and the lead layers 43 stacked one another on the end surfaces 41a, 41b of the spin valve film 41 tend to form swells 55, respectively, during the process of making the MR element 31. The swells 55 inevitably serve to define the grooves 54 on the upper shield layer 35. The upper non-magnetic gap layer 33 having a constant uniform thickness is interposed not only between the first interface 52 of the upper shield layer 35 and the surface of the spin valve film 41 but also between the second interfaces 53 and the surfaces of the domain control stripe layers 43. The upper shield layer 35 is thus allowed to contact the upper non-magnetic gap layer 33 at the first and second interfaces 52, 53, respectively.

The domain control stripe layers 42 incorporated in the MR element 31 are set to exhibit the magnetization Mg in a longitudinal direction running across the spin valve film 41 along the bottom surface 25. The magnetization Mg of the domain control stripe layers 42 is expected to establish a longitudinal bias field BS running from the north pole generated at the tip end of the domain control stripe layer 42 at the upstream of the magnetization Mg to the south pole generated at the tip end of the domain control stripe layer 42 at the downstream of the magnetization Mg, as shown in FIG. 5, for example. The longitudinal bias field BS greatly contributes to establishment of the single magnetic domain in the free ferromagnetic layer 45. The establishment of the single magnetic domain in the free ferromagnetic layer 45 in this manner serves to reduce the Barkhausen noise in the detected signal output from the MR element 31. The magnetic bit data can reliably be detected out of the magnetic recording disk 13 without an error.

In general, when the domain control stripe layers 42 are magnetized, the upper shield layer 35 is simultaneously subjected to an applied magnetic field for the magnetization of the domain control stripe layers 42. The upper shield layer 35 made from a soft magnetic material is supposed to exhibit a residual magnetization Mr in the direction of the magnetization Mg established in the domain control stripe layers 42 after subjected to the applied magnetic field for the magnetization of the domain control stripe layers 42. If the residual magnetization Mr is forced to terminate at any end surface of the upper shield layer 35, magnetic poles are established at the end surface, namely, the end of the magnetization Mr, as well known.

Since the lower surface of the upper shield layer 35 is set to extend over the flat single datum plane 51 in the aforementioned MR element 31, the residual magnetization Mr can be kept continuous to the utmost, and is hardly terminated on the lower surface of the upper shield layer 35 at a region opposed to the spin valve film 41. Any magnetic poles are hardly generated along the lower surface of the upper shield layer 35. The longitudinal bias field BS can be prevented from receiving the interaction of the residual magnetization Mr in the upper shield layer 35. Reduction in the longitudinal bias field BS can thus be suppressed. Even if the residual magnetization Mr discontinues at the grooves 54, for example, the north and south poles are inevitably generated in pairs in the individual groove 54. The north and south poles in the individual groove 54 are allowed to interact with each other, so that the north and south poles at the tip ends of the domain control stripe layers 42 cannot be influenced by the north and south poles in the grooves 54, respectively. Still, the longitudinal bias field BS can be avoided from reduction.

Figure 6A:
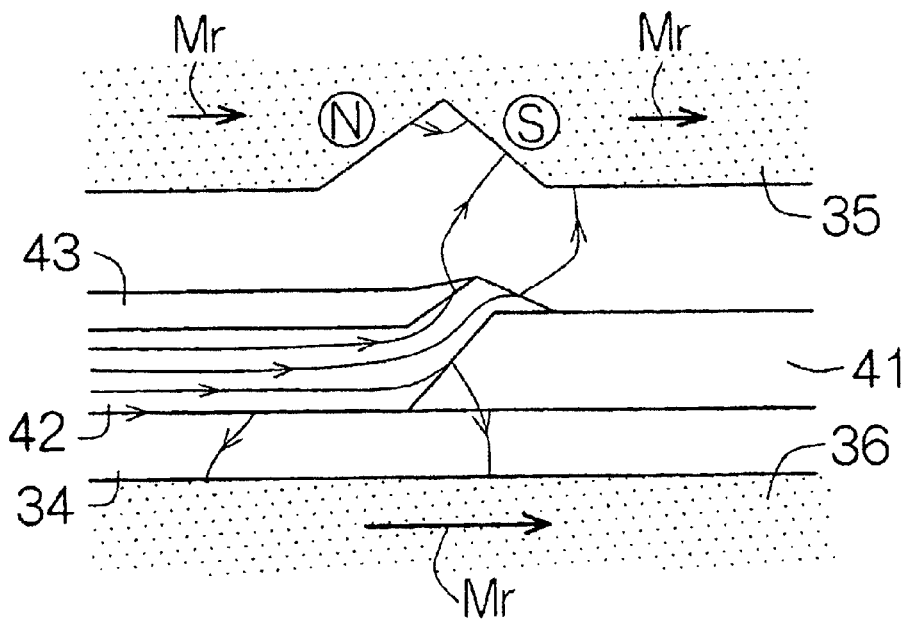
FIG. 6A illustrates a profile for the line of induction in the MR element of the first embodiment.
Figure 6B:
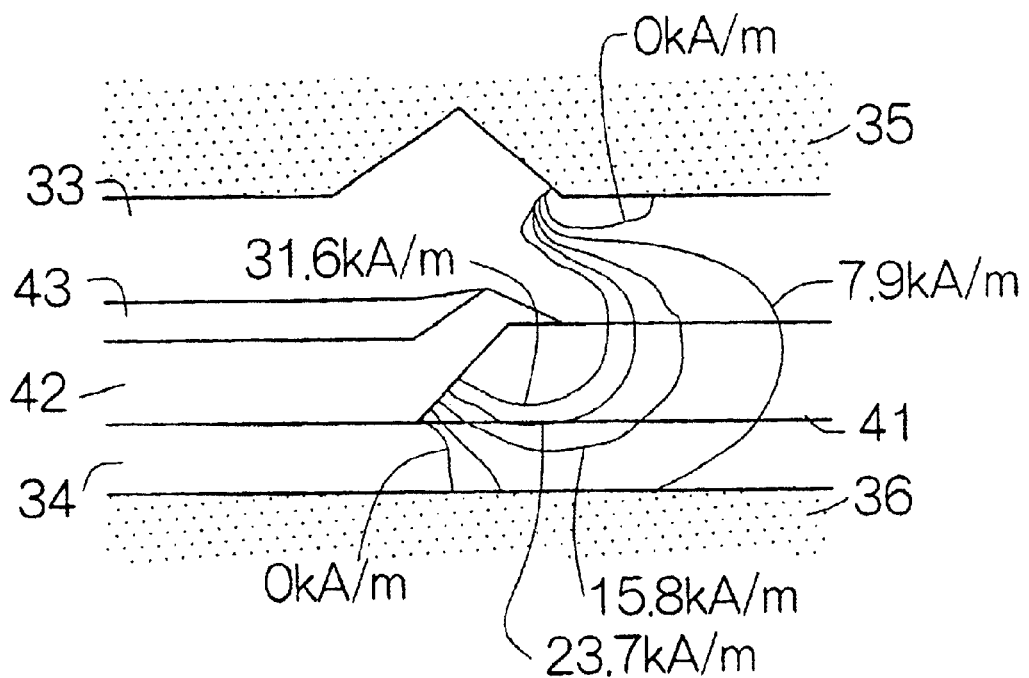
FIG. 6B illustrates a profile for the magnitude of the magnetic field in the MR element of the first embodiment.

The inventors have examined profiles for the lines of induction and the magnitude of the magnetic field in the MR element 31. The inventors utilized a planar or two-dimensional finite element method based on a magnetization model. Exchange coupling field was taken into account in calculation of the two-dimensional finite element method. As shown in FIG. 6A, even when the residual magnetization Mr was generated in the upper and lower shield layers 35, 36, the domain control stripe layer 42 was surely allowed to establish a uniform magnetization Mg directed to the tip end contacting the end surface 41a (41b) of the spin valve film 41. In addition, a pair of north and south poles in the groove 54 of the upper shield layer 35 were allowed to interact with each other, so that the magnetic pole at the tip end of the domain control stripe layer 42 hardly received the influence from the opposite magnetic pole in the groove 54. The domain control stripe layer 42 was thus allowed to generate a stronger magnetic field directed toward the spin valve film 41, as shown in FIG. 6B, for example.

Figure 7:
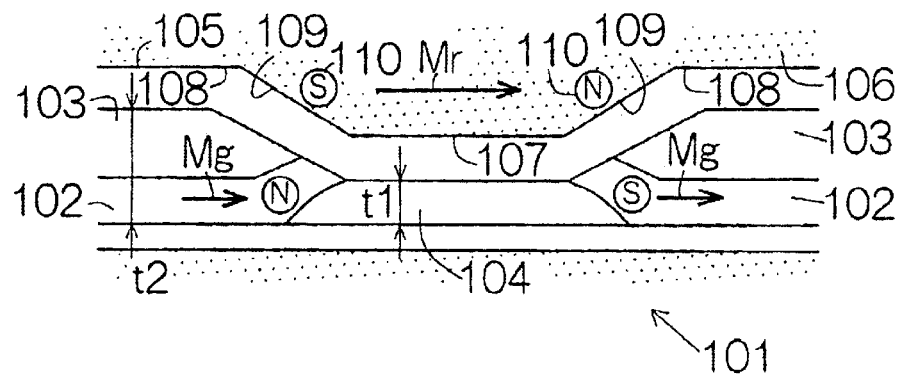
FIG. 7 is an enlarged partial front view of the read/write electromagnetic transducer for illustrating the structure of a conventional MR element.

To the contrary, the overall thickness t2 of a domain control stripe layer 102 and a lead layer 103 is in general set significantly larger than the thickness t1 of a spin valve film 104 in a conventional MR element 101, as shown in FIG. 7, for example. A non-magnetic gap layer 105 of a uniform thickness is formed to extend over the lead layers 103 and the spin valve film 104 in this situation. Larger steps 109 are thus defined on an upper shield layer 106 between a first planar interface 107, opposed to the surface of the spin valve film 104, and second planar interfaces 108, opposed to the respective surfaces of the lead layers 103, so as to extend in a direction vertical to the bottom surface 25. A residual magnetization Mr of the upper shield layer 106, resulting from a magnetic field for magnetization of the domain control stripe layers 102, is forced to terminate at the steps 109. Magnetic poles 110 are thus generated at the steps 109 on the upper shield layer 104, respectively. The generated magnetic poles 110 are expected to exert a stronger influence on the magnetic poles at the tip ends of the respective domain control stripe layers 102.

Figure 8A:
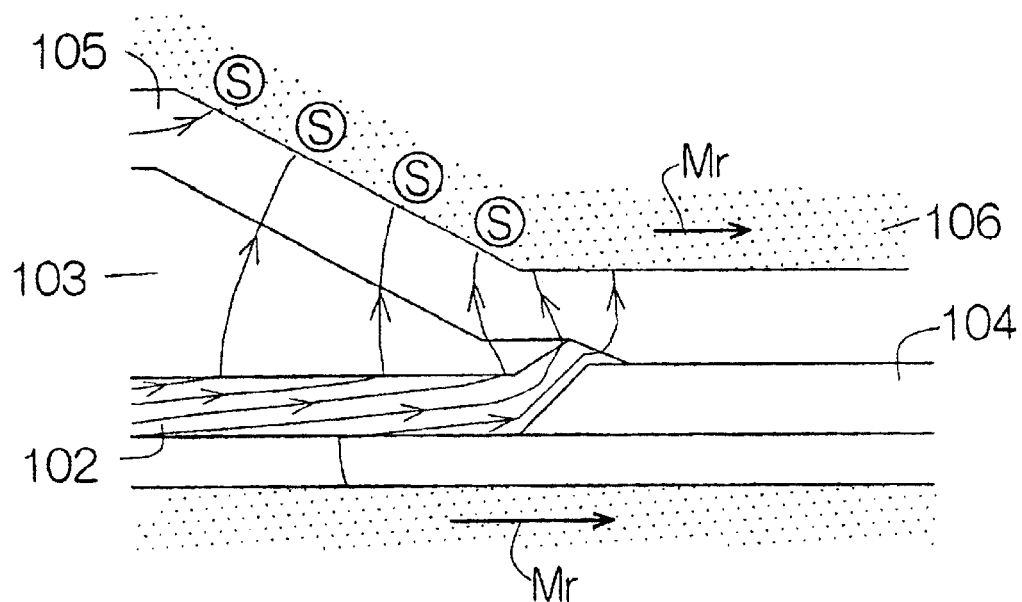
FIG. 8A illustrates a profile for the line of induction in the conventional MR element.
Figure 8B:
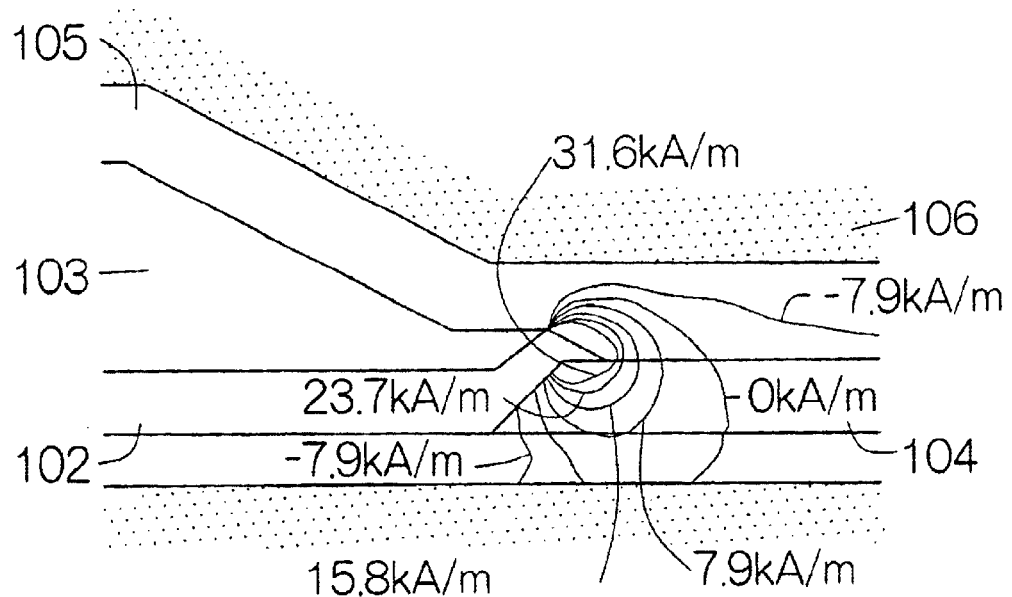
FIG. 8B illustrates a profile for the magnitude of the magnetic field in the conventional MR element.

The inventors have examined profiles for the lines of induction and the magnitude of the magnetic field in the conventional MR element 101 in the same manner as described above. As shown in FIG. 8A, when the residual magnetization Mr was generated in the upper and lower shield layers 35, 36, the magnetic poles 110, opposite to the magnetic poles at the corresponding domain control stripe layer 42, surely appeared at the steps 109, respectively, in the conventional MR element 101. Magnetic fields were thus induced between the magnetic poles 110 and the corresponding domain control stripe layers 102. The magnetic flux from the domain control stripe layers 102 failed to reach the spin valve film 104. As is apparent from FIG. 8B, the conventional MR element 101 only enabled generation of a weaker magnetic field at the tip end of the domain control stripe layer 102. The conventional MR element 101 is supposed to establish an insufficient longitudinal bias field BS between the opposed domain control stripe layers 102.

A conventional method may be employed to make the aforementioned MR element 31. Specifically, the lower non-magnetic gap layer 34, the spin valve film 41, the domain control stripe layers 42 and the lead layers 43 are sequentially formed on the lower shield layer 36. After the formation of the lead layers 43, the upper non-magnetic gap layer 33 and the upper shield layer 35 are formed. However, the domain-control stripe layers 42 and the lead layers 43 are forced to have the thickness smaller than that of the conventional ones so as to set the overall thickness t2 of the domain control layer 42 and the lead layer 43 at the level equal to the thickness t1 of the spin valve film 41. A material of a higher electric conductivity, such as Au, may be employed to realize the thinner lead layers 43, for example. Otherwise, the thickness of the basement layer 44 of the spin valve film 41 may be set larger than that of the conventional one. When the thicker basement layer 44 is employed in this manner, the thickness of the lower non-magnetic gap layer 34 is preferably set smaller than that of the conventional one. The lower non-magnetic gap layer 34 of the smaller thickness serves to absorb the increase in the thickness of the basement layer 44 so as to cancel the increase in the shield gap or read gap in the MR element 31. It is thus possible to prevent deterioration in the linear recording density.

Figure 9:
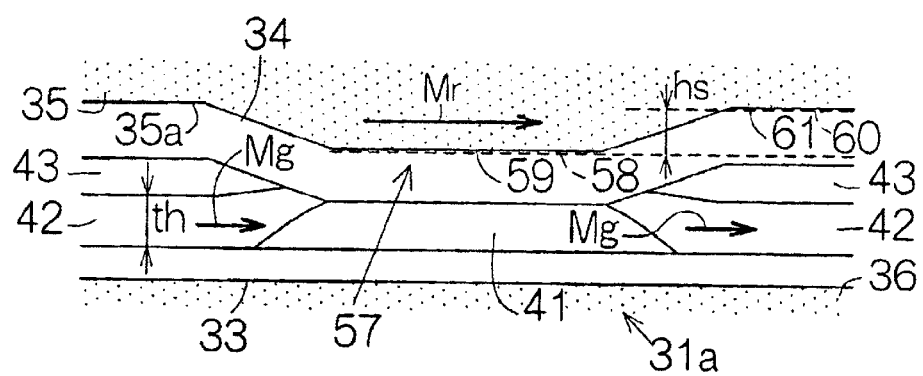
FIG. 9 is an enlarged partial front view of the rear/write electromagnetic transducer for illustrating the structure of a magnetoresistive (MR) element according to a second embodiment of the present invention.

FIG. 9 illustrates the magnetoresistive (MR) element 31a according to a second embodiment of the present invention. The MR element 31a of this type is designed to include a raised portion 57 formed on the upper shield layer 35 at a lower interface 35a opposed to the lower shield layer 36. The raised portion 57 is allowed to swell from the lower interface 35a toward the magnetoresistive film or spin valve film 41. A first planar boundary or interface 59 is defined on the top or lowest surface of the raised portion 57. The raised portion 57 is opposed to the spin valve film 41 at the first interface 59. The first interface 59 is designed to extend over a first datum plane 58 vertical to the bottom surface 25. A second planar boundary or interface 61 is defined on the upper shield layer 35 at the foot of the raised portion 57. The upper shield layer 35 is opposed to the domain control stripe layers 42 at the second interfaces 61. The second interfaces 61 are designed to extend over a second datum plane 60 likewise vertical to the bottom surface 25. The distance between the first and second datum planes 58, 60 is equivalent to the height hs of the raised portion 57, namely, the step defined between the first and second interfaces 59, 61. In particular, the intensity of the magnetic pole in the raised portion 57 is set smaller than that in the domain control stripe layers 42. The intensity of the magnetic pole in the raised portion 57 can be expressed by the product between the height hs of the raised portion 57 and the magnetization intensity of the upper shield layer 35, namely, the magnitude of the residual magnetization Mr in the upper shield layer 35. On the other hand, the intensity of the magnetic pole in the domain control stripe layers 42 can be expressed by the product between the thickness th and the magnetization intensity of the domain control stripe layers 42, namely, the magnitude of the residual magnetization Mg in the domain control stripe layers 42. Specifically, the inequality (hs×Mr) <(th×Mg) should be established in the MR element 31a. Like reference numerals are attached to the structures or components identical or equivalent to those of the aforementioned first embodiment.

Figure 10A:
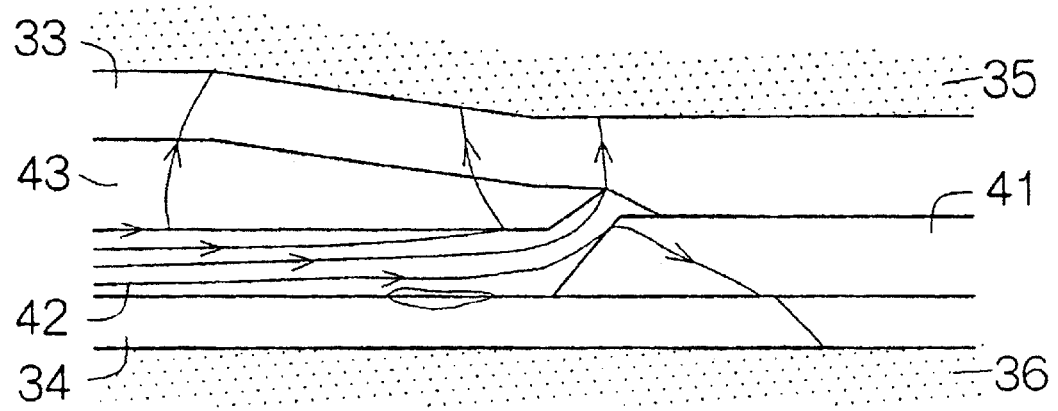
FIG. 10A illustrates a profile for the line of induction in the MR element of the second embodiment.
Figure 10B:
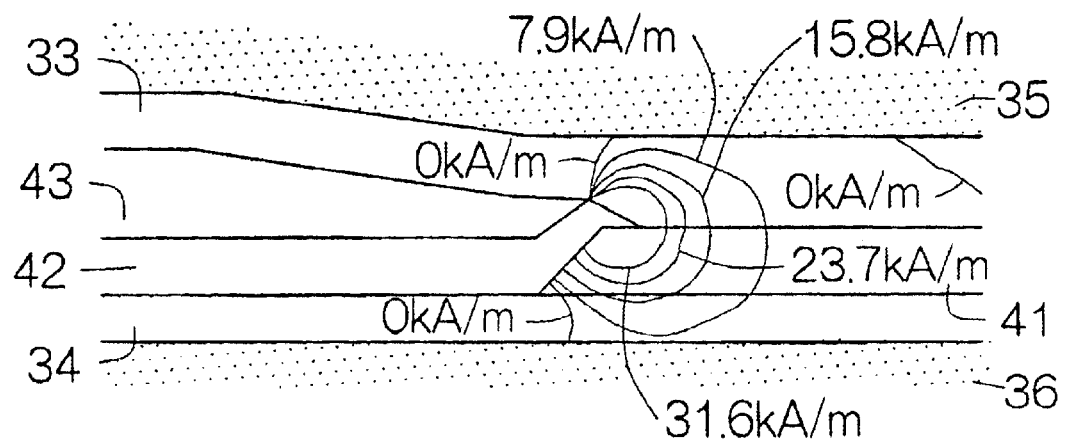
FIG. 10B illustrates a profile for the magnitude of the magnetic field in the MR element of the second embodiment.

The inventors have examined profiles for the lines of induction and the magnitude of the magnetic field in the MR element 31a in the aforementioned manner. As shown in FIG. 10A, the magnetic fields induced between the magnetic poles on the raised portion 57 or the steps and the domain control stripe layers 42 can be reduced as compared with the conventional MR element 101. As shown in FIG. 10B, a relatively stronger magnetic field can be obtained at the tip ends of the domain control stripe layers 42, respectively, in the MR element 31a as compared with the conventional MR element 101. Reduction in the longitudinal bias field BS can thus relatively be suppressed in the MR element 31a.

Figure 11:
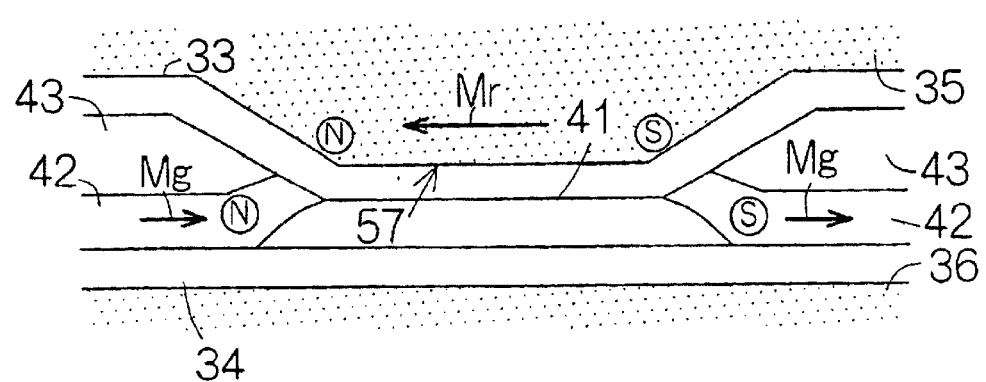
FIG. 11 is an enlarge partial front view of the rear/write eletromagnetic transducer for illustrating the structure of a magnetoresistive (MR) element according to a third embodiment of the present invention.
Figure 12:
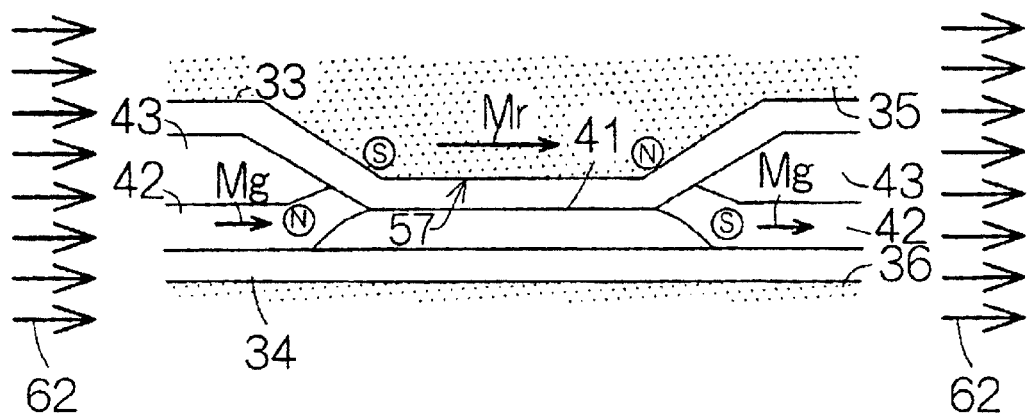
FIG. 12 is an enlarged partial front view of the read/write electromagnetic transducer for illustrating the process of magnetizing the domain control stripe layers in the MR element of the third embodiment.
Figure 13:
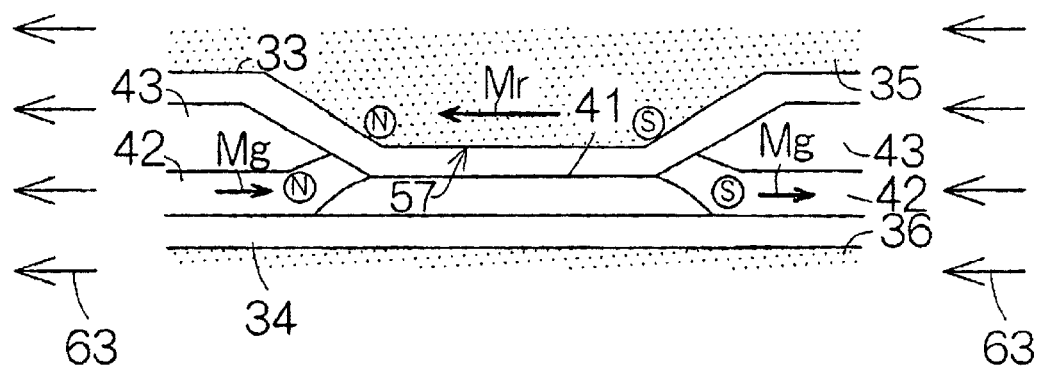
FIG. 13 is an enlarged partial front view of the read/write electromagnetic transducer for illustrating the process of magnetizing the upper shield layer in the MR element of the third embodiment.

FIG. 11 illustrates the magnetoresistive (MR) element 31b according to a third embodiment of the present invention. The upper shield layer 35 in this MR element 31b is designed to have the residual magnetization Mr in the reverse longitudinal direction opposite to the normal longitudinal direction of the magnetization Mg in the domain control stripe layers 42. A method of making the MR element 31b of this type may include subjecting the entire MR element 31b to a magnetic field 62 of a first intensity for magnetizing the domain control stripe layers 42 in a normal direction, as shown in FIG. 12, for example. The entire MR element 31b is thereafter subjected to a magnetic field 63 of a second intensity, smaller or weaker than the first intensity, for magnetizing the upper shield layer 35 in the reverse direction opposite to the normal direction, as shown in FIG. 13. In this case, the first intensity of the magnetic field 62 may be set depending upon the coercive force Hc of the domain control stripe layers 42, which is equal to approximately 80 kA/m, for example. The second intensity of the magnetic field 63 may be set depending upon the coercive force Hc of the upper shield layer 35, which is equal to approximately 40 A/m, for example. The intensity of the magnetic field 63 is only allowed to exhibit the intensity enough to magnetize the upper shield layer 35 without reducing the magnetization Mg established in the domain control stripe layers 42. Note that like reference numerals are attached to the structures or components identical or equivalent to those of the aforementioned first and second embodiments.

Figure 14A:
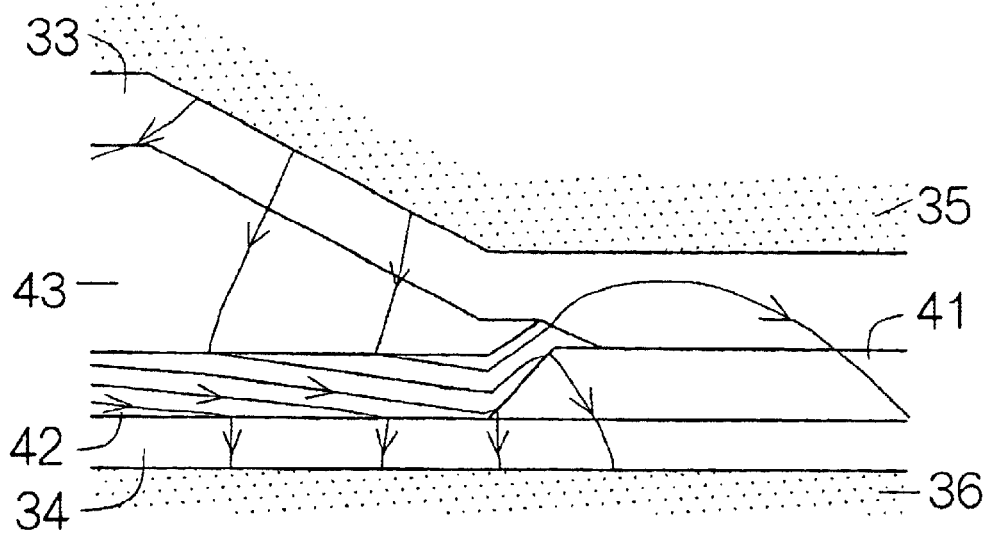
FIG. 14A illustrates a profile for the line of induction in the MR element of the third embodiment.
Figure 14B:
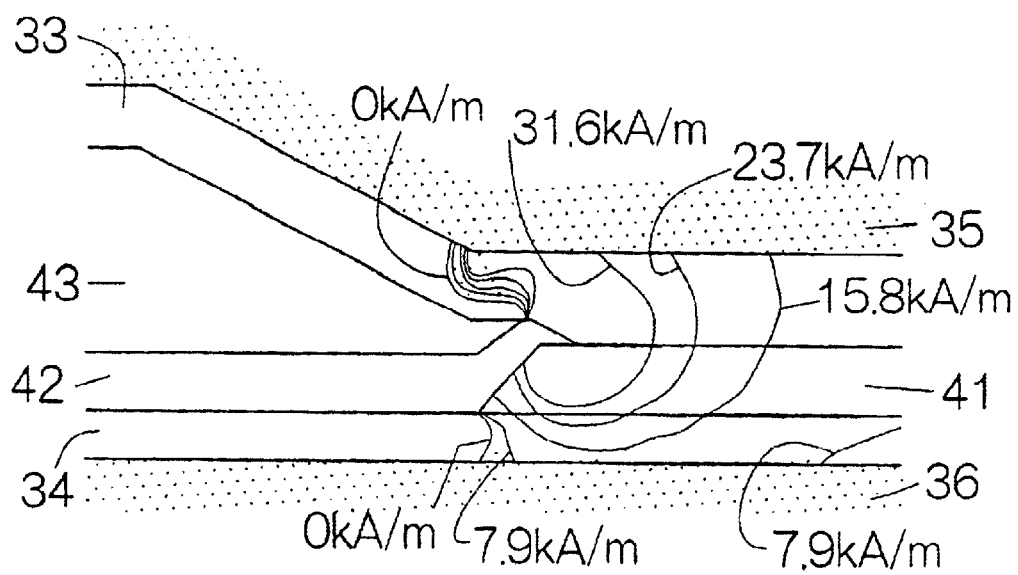
FIG. 14B illustrates a profile for the magnitude of the magnetic field in the MR element of the third embodiment.

The inventors have examined profiles for the lines of induction and the magnitude of the magnetic field in this MR element 31b in the aforementioned manner. As shown in FIG. 14A, the magnetic flux resulting from the magnetic poles on the raised portion 57 or the steps is allowed to reinforce the magnetization Mg in the domain control stripe layers 42. A remarkably larger magnetic field can be generated at the tip ends of the domain control stripe layers 42 in the MR element 31b, as is apparent from FIG. 14B. The longitudinal bias field BS can still be enhanced between the domain control stripe layers 42.

What is claimed is:

1. A magnetoresistive transducer comprising:
   a magnetoresistive film extending over a surface of a fundamental layer;
   a pair of domain control layers extending over the surface of the fundamental layer so as to interpose the magnetoresistive film along the fundamental layer;
   a first lead layer spreading over a surface of one of the domain control layers without contacting the other domain control layer;
   a second lead layer spreading over a surface of the other domain control layer without contacting the one of the domain control layer;
   an upper shield layer opposed to the magnetoresistive film at a first interface extending along a datum plane, said upper shield layer opposed to the domain control layers at a second interface extending along the datum plane; and a groove formed on the upper shield layer so as to isolate the first and second interfaces from each other.

2. The magnetoresistive transducer according to claim 1, wherein said fundamental layer is a lower non-magnetic gap layer spreading over a surface of a lower shield layer.

3. The magnetoresistive transducer according to claim 2, further comprising an upper non-magnetic gap layer interposed between the magnetoresistive film and the upper shield layer, said upper shield layer contacting the upper non-magnetic gap layer at the first interface.

4. The magnetoresistive transducer according to claim 3, wherein said first and second lead layers are made of an Au thin film is interposed between the domain control layers and the upper shield layer.

5. The magnetoresistive transducer according to claim 4, wherein said upper non-magnetic gap layer extends over the first and second lead layers, said upper shield layer contacting the upper non-magnetic gap layer at the second interface.

6. A magnetoresistive transducer comprising:
   a magnetoresistive film extending over a surface of a fundamental layer;
   a pair of domain control layers extending over the surface of the fundamental layer so as to interpose the magnetoresistive film along the fundamental layer;
   an upper shield layer opposed to the magnetoresistive film at a first interface extending along a datum plane, said upper shield layer opposed to the domain control layers at a second interface extending along the datum plane; and
   a groove formed on the upper shield layer so as to isolate the first and second interfaces from each other.

7. The magnetoresistive transducer according to claim 6, wherein said fundamental layer is a lower non-magnetic gap layer spreading over a surface of a lower shield layer.

8. The magnetoresistive transducer according to claim 7, further comprising an upper non-magnetic gap layer interposed between the magnetoresistive film and the upper shield layer, said upper shield layer contacting the upper non-magnetic gap layer at the first interface.

9. The magnetoresistive transducer according to claim 8, wherein a lead layer made of an Au thin film is interposed between at least one of the domain control layers and the upper shield layer.

10. The magnetoresistive transducer according to claim 9, wherein said upper non-magnetic gap layer extends over the lead layer, said upper shield layer contacting the upper non-magnetic gap layer at the second interface.

11. A magnetoresistive transducer comprising:
    a magnetoresistive film extending over a surface of a fundamental layer;
    a pair of domain control layers extending over the surface of the fundamental layer so as to interpose the magnetoresistive film along the fundamental layer;
    an upper shield layer opposed to the magnetoresistive film at a first interface, said upper shield layer opposed to the domain control layers at a second interface; and
    a groove formed between the first interface and the second interface on said upper shield layer so as to isolate the first and second interfaces from each other, said groove sinking into the upper shield layer from the first and second interfaces.

* * * * *